United States Patent [19]

Ohmura et al.

[11] 4,208,477

[45] Jun. 17, 1980

[54] HEAT RESISTANT PHOTORESIST COMPOSITION AND PROCESS FOR PREPARING THE SAME

[75] Inventors: Kaoru Ohmura; Ichiro Shibasaki; Takeo Kimura, all of Fuji, Japan

[73] Assignee: Asahi Kasei Kogyo Kabushiki Kaisha, Osaka, Japan

[21] Appl. No.: 961,462

[22] Filed: Nov. 16, 1978

[30] Foreign Application Priority Data

Dec. 26, 1977 [JP] Japan ................................ 52-155610
Dec. 27, 1977 [JP] Japan ................................ 52-156687

[51] Int. Cl.$^2$ ........................ G03C 1/72; G03C 18/09
[52] U.S. Cl. .................... 430/281; 430/288; 204/159.14; 204/159.19; 204/159.23; 204/159.18; 525/453; 525/419
[58] Field of Search ............... 96/115 R, 115 P; 204/159.14, 159.1 B, 159.22, 159.23; 528/46, 333

[56] References Cited

U.S. PATENT DOCUMENTS

| | | | |
|---|---|---|---|
| 3,623,870 | 11/1971 | Curran et al. | 96/49 |
| 3,918,973 | 11/1975 | Meriens | 96/115 R |
| 3,929,713 | 12/1975 | D'Alelio | 528/333 |
| 4,048,144 | 9/1977 | Stephens | 528/333 |
| 4,093,461 | 6/1978 | Loprest et al. | 96/35.1 |
| 4,106,943 | 8/1978 | Ikeda et al. | 96/115 R |

FOREIGN PATENT DOCUMENTS 53-5298  1/1978  Japan .
53-5299  1/1978  Japan .
53-5300  1/1978  Japan .

*Primary Examiner*—Jack P. Brammer
*Attorney, Agent, or Firm*—Finnegan, Henderson, et al.

[57] ABSTRACT

An organic polar solvent-soluble aromatic polyamide-imide having therein aromatic nuclei linked at their respective 1- and 3-positions and having therein amide linkages and terminal groups unsubstituted or partially substituted with acrylate or methacrylate groups is found to impart excellent heat resistance and insulating property to a photoresist composition produced therefrom.

6 Claims, No Drawings

HEAT RESISTANT PHOTORESIST COMPOSITION AND PROCESS FOR PREPARING THE SAME

This invention relates to a photoresist composition. More particularly, the present invention relates to a novel photoresist composition which is excellent not only in insulating property but also heat resistance. The present invention is also concerned with a process for the preparation of a novel photoresist composition of the character described above.

Various kinds of photoresist compositions have heretofore been proposed. Many of such conventional photoresist compositions, however, have not a high heat resistance and an excellent insulating property even though they are sufficient in photosensitivity. In fact, there is scarcely available such a photoresist composition as is excellent not only in photosensitivity but also heat resistance and insulating property.

Recently, in the field of electronic industries, due to an increased demand for high density circuit, there is a tendency of developing multi-layer type circuit systems in the production of semi-conductor circuit boards, hybrid circuit boards, printed circuit boards and the like. For realizing such boards having a multi-layer type circuit system which has multi-laid circuits each photochemically formed one upon another, a photoresist once formed in each layer of a circuit system is required to be left unremoved. The conventional photoresist compositions, however, are generally poor in heat resistance as well as insulating property and, hence, the photoresists produced therefrom cannot stand severe conditions for the subsequent formation of a next layer of a circuit system and for bonding other electric elements to the circuit board, so that they cannot be left unremoved. Therefore, it has long been earnestly desired to develop a photoresist composition capable of providing a photoresist which is excellent not only in insulating property but also heat resistance so that it can, after once formed, not only be left unremoved for serving as an insulating base necessary for the subsequent formation of a next layer of a circuit system thereon but also stand severe conditions for bonding other electric elements to the circuit board.

The inventors of the present invention have made extensive and intensive investigations with a view to developing a photoresist composition which is excellent not only in photosensitivity but also heat resistance and insulating property. As a result, it has been found that a composition comprising (1) an organic polar solvent-soluble aromatic polyamide-imide having aromatic nuclei linked at their respective 1- and 3-positions and optionally having an acrylate group and/or a methacrylate group introduced thereinto, (2) a photopolymerization initiator and (3) a compound having in its molecule at least one ethylenically unsaturated double bond, can provide a photoresist which is extremely excellent not only in insulating property but also heat resistance. The present invention has been made based on such a novel finding.

Accordingly, it is an object of the present invention to provide a photoresist composition which is excellent not only in photosensitivity but also heat resistance and insulating property.

It is another object of the present invention to provide a photoresist composition of the character described, which is extremely excellent in heat resistance and useful especially as a photoresist for making a multi-layer type circuit system.

It is a further object of the present invention to provide a process for the preparation of a photoresist composition of the kind described.

The foregoing and other object, features and advantages of the present invention will be apparent to those skilled in the art from the following detailed description and appended claims.

According to one aspect of the present invention, there is provided a heat resistant photoresist composition comprising:

(1) 100 parts by weight of a polymer selected from the group consisting of
a polymer ($\alpha$) of the general formula

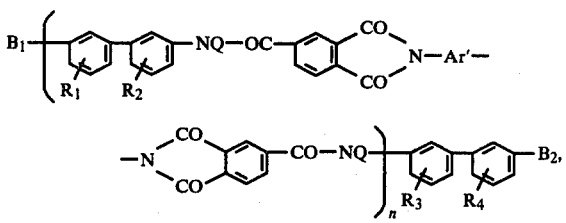

a polymer ($\beta$) of the general formula

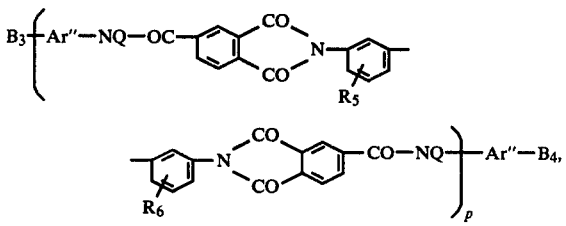

a polymer ($\gamma$) of the general formula

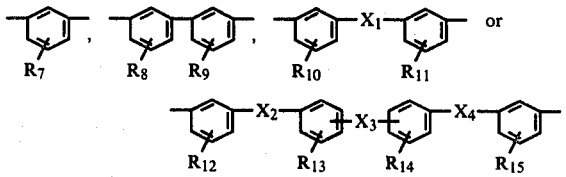

and mixtures thereof
wherein
$R_1$ and $R_6$ are the same or different and each represent a hydrogen atom, a ($C_1$-$C_4$) alkyl group or a halogen atom,
Ar represents

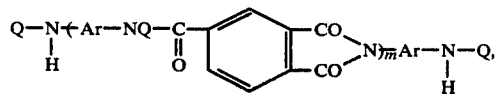

wherein
$R_7$ to $R_{15}$ are the same or different and each have the same meaning as defined with respect to $R_1$ to $R_6$ and $X_1$ to $X_4$ are the same or different and each represent —O—, —$SO_2$—, —$CH_2$—, —CO—, —CO—, —C($CH_3$)$_2$—, —S— or —($CH_2$)$_2$—,
Ar' represents

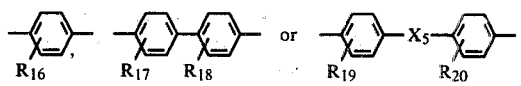

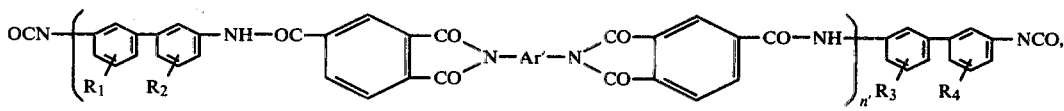

same meaning as defined with respect to $R_1$ to $R_6$ and
$X_5$ has the same meaning as defined with respect to $X_1$ to $X_4$,
Ar" has the same meaning as defined with respect to Ar or Ar',
$B_1$ to $B_4$ are the same or different and each represent —NCO or a substituent (A) formed by the reaction of —NCO with acrylic acid, methacrylic acid, a hydroxy acrylate or a hydroxy methacrylate, Q represents a hydrogen atom, or a hydrogen atom and a substituent (A'), provided that each of the rates of substituent introduction into the molecules of the polymers ($\alpha$), ($\beta$) and ($\gamma$) as defined by the formulae $$\frac{\text{number of substituent } (A') \text{ in the molecule}}{m+2} \times 100,$$

$$\frac{\text{number of substituents } (A) + (A') \text{ in the molecule}}{2 \times n + 2} \times 100 \text{ and}$$

$$\frac{\text{number of substituents } (A) + (A') \text{ in the molecule}}{2 \times p + 2} \times 100$$

with respect to the polymer ($\alpha$), the polymer ($\beta$) and the polymer ($\gamma$), respectively, is 0 to 50%, said substituent (A') being a member selected from residual groups of acrylic acid chloride, methacrylate acid chloride, glycidyl acrylate and glycidyl methacrylate, said residual groups being introduced alone or in combination, and m, n and p are integers corresponding to reduced viscosities of 0.1 to 2.0 with respect to the polymer ($\alpha$) the polymer ($\beta$) and the polymer ($\gamma$), respectively;

(2) 0.01 to 20 parts by weight of a photopolymerization initiator; and (3) 0.1 to 100 parts by weight of a compound having in its molecule at least one ethylenically unsaturated double bond.

According to another aspect of the present invention, there is provided a process for the preparation of a heat resistant photoresist composition which comprises: reacting an organic polar solvent-soluble aromatic polyamide-imide having aromatic nuclei linked at their respective 1- and 3-positions and selected from the group consisting of a polyamide-imide ($\alpha'$) of the general formula

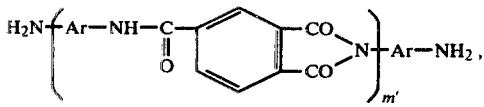

a polyamide-imide ($\beta'$) of the general formula

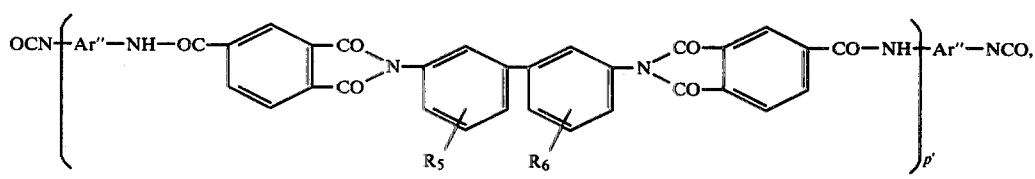

a polyamide-imide ($\gamma'$) of the general formula

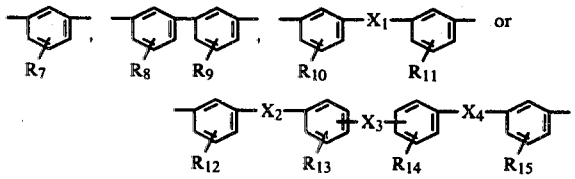

and mixtures thereof
wherein
$R_1$ to $R_6$ are the same or different and each represent a hydrogen atom, a ($C_1$-$C_4$) alkyl group or a halogen atom,
Ar represents

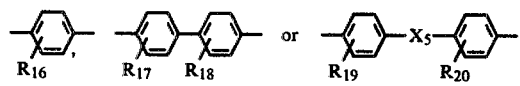

wherein
$R_7$ to $R_{15}$ are the same or different and each have the same meaning as defined with respect to $R_1$ to $R_6$ and
$X_1$ to $X_4$ are the same or different and each represent —O—, —SO$_2$—, —CH$_2$—, —CO—, —COO—, —C(CH$_3$)$_2$—, —S— or —(CH$_2$)$_2$—,
Ar' represents

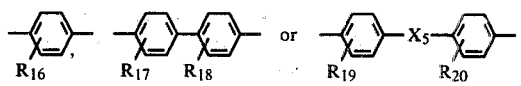

wherein
$R_{16}$ to $R_{20}$ are the same or different and each have the same meaning as defined with respect to $R_1$ to $R_6$ and
$X_5$ has the same meaning as defined with respect to $X_1$ to $X_4$,
Ar" has the same meaning as defined with respect to Ar or Ar', and
m', n' and p' are integers corresponding to reduced viscosities of 0.1 to 2.0 with respect to the polyamide-imide ($\alpha'$), the polyamide-imide ($\beta'$) and the polyamide-imide ($\gamma'$), respectively,
with a reactant selected from the group consisting of acrylic acid chloride, methacrylic acid chloride, glycidyl acrylate, glycidyl methacrylate, acrylic acid, methacrylic acid, a hydroxy acrylate, a hydroxy methacrylate and mixtures thereof, in the presence of an organic polar solvent, to produce a polymer; and mixing 100 parts by weight of the resulting polymer with 0.01 to 20 parts by weight of a photopolymerization initiator and 0.1 to 100 parts by weight of a compound having in its molecule at least one ethylenically unsaturated double bond.

Generally available aromatic polyamide-imides are insoluble in an organic polar solvent and therefore it is impossible to prepare a solution of the aromatic polyamide-imide. This leads to such fatal disadvantages that the aromatic polyamide-imide cannot be coated, using a solution thereof, on a substrate for a circuit board to form a photoresist composition layer and that it is impossible to introduce into the aromatic polyamide-imide a substituent, such as an acrylate group or a methacrylate group, which is useful for improving properties of the aromatic polyamide-imide.

On the other hand, with respect to introduction of the above-mentioned useful substituent into the polyamide-imide, it is conceivable to introduce the substituent into an organic solvent-soluble aromatic polyamide acid that is an intermediate for the preparation of an aromatic polyamide-imide. In this introduction method, however, it is extremely difficult to control the reaction for the introduction of the substituent. In addition, the aromatic polyamide acid is liable to undergo hydrolysis, due to the presence of the carboxyl group adjacent to the amide linkage in the molecule, and, hence, if the aromatic polyamide acid is kept in the form of a solution thereof for a long period of time, it does inevitably undergo hydrolysis, causing the molecular weight of the polyamide acid to be extremely lowered with disadvantages. Moreover, it is noted that in order to convert the aromatic polyamide acid to the corresponding polyamide-imide, a high-temperature heat treatment is necessarily conducted after coating of the solution of the aromatic polyamide acid.

As described, according to the present invention, there is employed, as a polymer for a photoresist composition, an aromatic polyamide-imide having aromatic nuclei linked at their respective 1- and 3-positions. Such an aromatic polyamide-imide having aromatic nuclei linked at their respective 1- and 3-positions is soluble in an organic polar solvent and, hence, it can advantageously be coated using a solution thereof. Furthermore, it should be noted that an acrylate group or a methacrylate group can be readily introduced into an aromatic polyamide-imide by the reaction between an organic polar solvent-soluble aromatic polyamide-imide having amide linkages and terminal groups all unsubstituted and a source of acrylate group or methacrylate group in the presence of an organic polar solvent. A photoresist composition containing the thus obtained aromatic polyamide-imide having amide linkages and terminal groups partially substituted with acrylate or methacrylate groups is stable and soluble in an organic polar solvent so that it can advantageously be coated using a solution thereof. In the present invention, there may advantageously be employed an organic polar solvent-soluble polyamide-imide having amide-linkages and terminal groups all unsubstituted as a polymer for a photoresist composition, but the above-mentioned polyamide-imide having acrylate or methacrylate groups introduced thereinto imparts to the photoresist composition further improved characteristics in respect of photosensitivity or image forming property, insulating property and heat resistance. The organic polar solvent-soluble aromatic polyamide-imides can provide a layer of a photoresist composition only by coating the solution thereof and then removing the solvent.

A polyamide-imide to be employed as a polymer for a photoresist composition of the present invention is a member selected from the group consisting of:

a polymer ($\alpha$) of the general formula

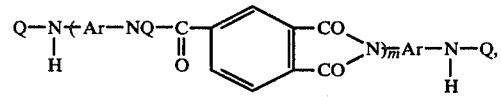

a polymer ($\beta$) of the general formula

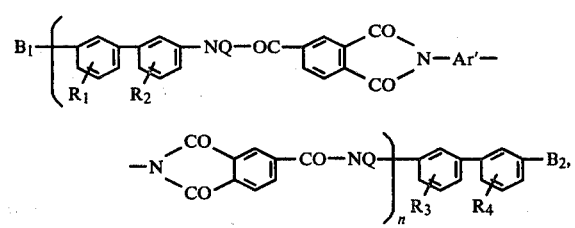

a polymer ($\gamma$) of the general formula

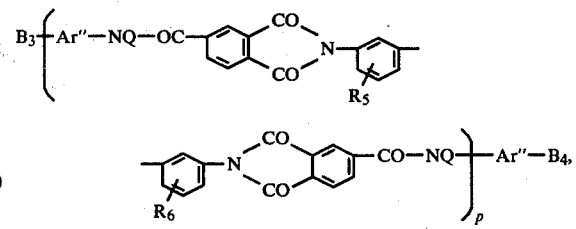

and mixtures thereof
wherein
$R_1$ to $R_6$ are the same or different and each represent a hydrogen atom, a ($C_1$–$C_4$) alkyl group or a halogen atom, Ar represents

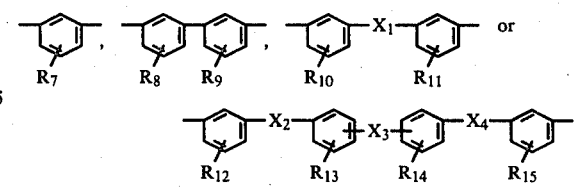

wherein
$R_7$ to $R_{15}$ are the same or different and each have the same meaning as defined with respect to $R_1$ to $R_6$ and
$X_1$ to $X_4$ are the same or different and each represent —O—, —SO$_2$—, —CH$_2$—, —CO—, —COO—, —C(CH$_3$)$_2$—, —S— or —(CH$_2$)$_2$—, Ar' represents

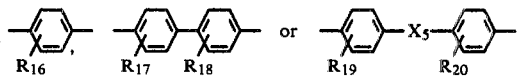

wherein
R$_{16}$ to R$_{20}$ are the same or different and each have the same meaning as defined with respect to R$_1$ to R$_6$ and
X$_5$ has the same meaning as defined with respect to X$_1$ to X$_4$, Ar" has the same meaning as defined with respect to Ar or Ar', B$_1$ to B$_4$ are the same or different and each represent —NCO or a substituent (A) formed by the reaction of —NCO with acrylic acid, methacrylic acid, a hydroxy acrylate or a hydroxy methacrylate, Q represents a hydrogen atom, or a hydrogen atom and a substituent (A'), provided that each of the rates of substituent introduction into the molecules of the polymers (α), (β) and (γ) as defined by the formulae $$\frac{\text{number of substituent } (A') \text{ in the molecule}}{m+2} \times 100,$$

$$\frac{\text{number of substituents } (A) + (A') \text{ in the molecule}}{2 \times n + 2} \times 100 \text{ and}$$

$$\frac{\text{number of substituents } (A) + (A') \text{ in the molecule}}{2 \times p + 2} \times 100$$

with respect to the polymer (α), the polymer (β) and the polymer (γ), respectively, is 0 to 50%, said substituent (A') being a member selected from residual groups of acrylic acid chloride, methacrylic acid chloride, glycidyl acrylate and glycidyl methacrylate, said residual groups being introduced alone or in combination, and m, n and p are integers corresponding to reduced viscosities of 0.1 to 2.0 with respect to the polymer (α) the polymer (β) and the polymer (γ), respectively.

In the above-mentioned polymers, the substituents given for defining Ar and the substituents given for defining Ar' may be employed alone or in combination. In the definition of R$_1$ to R$_{20}$, the ( C$_1$-C$_4$) alky group may be straight or branched alkyl group, such as methyl, ethyl, n-propyl, isopropyl, n-butyl, sec.-butyl and tert.-butyl. The substituents given for defining the terminal groups B$_1$ to B$_4$ may also be employed alone or in combination.

As described, the organic polar solvent-soluble aromatic polyamide-imides having acrylate or methacrylate groups introduced thereinto are prepared by a process which comprises: reacting an organic polar solvent-soluble aromatic polyamideimide having aromatic nuclei linked at their respective 1-and 3-positions and selected from the group consisting of a polyamide-imide (α') of the general formula

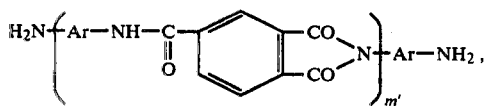

a polyamide-imide (β') of the general formula

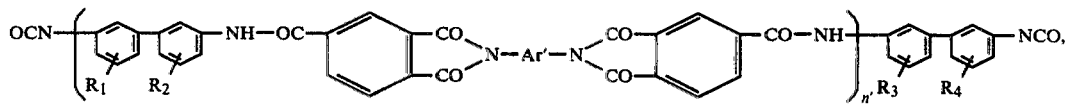

a polyamide-imide (γ') of the general formula

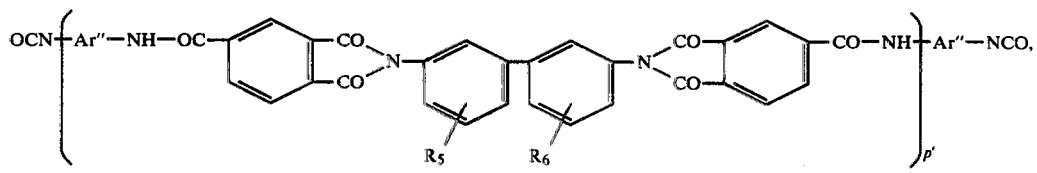

and mixtures thereof wherein
R$_1$ to R$_6$ are the same or different and each represent a hydrogen atom, (C$_1$-C$_4$) alkyl group or a halogen atom,
Ar represents

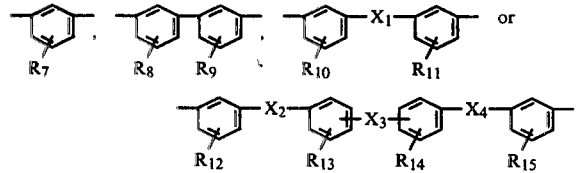

wherein
R$_7$ to R$_{15}$ are the same or different and each have the same meaning as defined with respect to R$_1$ to R$_6$ and X$_1$ to X$_4$ are the same or different and each represent —O—, —SO$_2$—, —CH$_2$—, —CO—, —COO—, —C(CH$_3$)$_2$—, —S— or —(CH$_2$)$_2$—,
Ar' represents

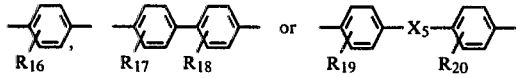

wherein
R$_{16}$ to R$_{20}$ are the same or different and each have the same meaning as defined with respect to R$_1$ to R$_6$ and
X$_5$ has the same meaning as defined with respect to X$_1$ to X$_4$,
Ar" has the same meaning as defined with respect to Ar or Ar', and
m', n' and p' are integers corresponding to reduced viscosities of 0.1 to 2.0 with respect to the polyamide-imide (α'), the polyamide-imide (β') and the polyamide-imide (γ'), respectively, with a rectant selected from the group consisting of acrylic acid chloride, methacrylic acid chloride, glycidyl acrylate, glycidyl methacrylate, acrylc acid, methacrylic acid, a hydroxy acrylate, a hydroxy methacrylate and mixtures thereof, in the presence of an organic polar solvent.

It will be easily understood that m', n' and p' as defined in the formulae of the polyamide-imides (α'), (β') and (γ') are equal to m, n and p as defined in the formulae of the polymers (α), (β) and (γ).

Of the reactants in the above-mentioned process, acrylic acid chloride, methacrylic acid chloride, glycidyl acrylate and glycidyl methacrylate are especially preferred.

Specific examples of hydroxy acrylates include 2-hydroxyethyl acrylate, 2-hydroxypropyl acrylate and 1,4-butylene glycol monoacrylate. Specific examples of hydroxy methacrylates include 2-hydroxyethyl methacrylate, 2-hydroxypropyl methacrylate, 2-hydroxy-3-chloropropyl methacrylate, hydroxyallyl methacrylate, 1,4-butylene glycol monomethacrylate, polypropylene glycol monomethacrylate (number average molecular weight: 1,000 to 4,000) and glycerol monomethacrylate.

Acrylic acid chloride, methacrylic acid chloride, glycidyl acrylate, glycidyl methacrylate, acrylic acid, methacrylic acid, a hydroxy acrylate, a hydroxy methacrylate or a mixture thereof to be reacted with the above-mentioned organic polar solvent-soluble aromatic polyamide-imide having aromatic nuclei linked at their respective 1- and 3-positions may be used in an amount of 0.001 to 10 moles per mole of the polymeric unit of the aromatic polyamide-imide. As aforementioned, the rate of introduction of a substituent (A') or substituents (A) and (A') is 0 to 50%, preferably 0.1 to 20%. The reaction is effected in the presence of an organic polar solvent such as N,N-dimethylacetamide, N,N-dimethyl formamide, N-methyl-2-pyrrolidone, dimethyl sulfoxide, hexamethylphosphoramide, or a mixture thereof. The reaction may be effected in the conjoint presence of the above-mentioned organic polar solvent and an ordinary solvent such as benzene, toluene, xylene, dioxane, cresol or a mixture thereof. The solvent may be used in an amount 2 to 100 times by weight as much as that of the aromatic polyamide-imide to be subjected to the reaction. The reaction may usually be carried out at a temperature of 0° to 150° C. for 1 to 24 hours. In the above-mentioned reaction, a catalyst such as a tertiary amine or a quaternary ammonium salt may be employed. As illustrative examples of the catalyst, there can be mentioned, for example, tertiary amines such as trimethylamine, triethylamine, tripropylamine, tributylamine, allyldiethylamine, dimethylbutylamine, diethylisopropylamine, benzyldimethylamine, dioctylbenzylamine, dioctylchlorobenzylamine, dimethylcyclohexylamine, dimethylphenethylamine, benzylmethylethylamine, chlorophenethylbromobenzylamine, dimethylaminophenylpropane, dimethylaminopentane, N,N-dimethylaniline, methyldiphenylamine, pyridine, quinuclidine, N-alkylpyrrole, N-alkylpyrrolidine, N-alkylpiperidine, quinoline, isoquinoline, N-alkyltetrahydroquinoline, N-alkyltetrahydroisoquinoline, N-alkylmorpholine and the like; and quaternary ammonium salts of the above-mentioned amines. The catalyst may be employed in an amount of 0.1 to 100% by weight based on the polyamide-imide to be subjected to the reaction.

The solution of an aromatic polyamide-imide having acrylate groups or methacrylate groups introduced thereinto which solution has been obtained as the reaction mixture after the reaction, may be used as such for forming a photoresist composition layer by coating. However, the solution may preferably be poured into a solvent incapable of dissolving thereinto the aromatic polyamide-imide having acrylate groups or methacrylate groups introduced thereinto to precipitate the same, followed by separation of the precipitate to remove therefrom impurities. As such as precipitating solvent, there can be mentioned, for example, water, methanol, acetone, toluene, cyclohexane and mixtures thereof. The precipitate of the aromatic polyamide-imide having acrylate groups or methyacrylate groups introduced thereinto is again dissolved into an organic polar solvent and the resulting solution is used for forming a photoresist composition layer by coating. As such an organic polar solvent, there can be mentioned, for example, N,N-dimethylacetamide, N,N-dimethylformamide, N-methyl-2-pyrrolidone, dimethyl sulfoxide, hexamethylphosphoramide or a mixture thereof. These solvents may be used in combination with an ordinary solvent such as benzene, toluene, xylene, dioxane, cresol or a mixture thereof.

The polyamide-imides (α'), (β') and (γ') to be employed for the preparation of the corresponding polymers each having acrylate or methacrylate groups introduced thereinto are respectively represented as follows:

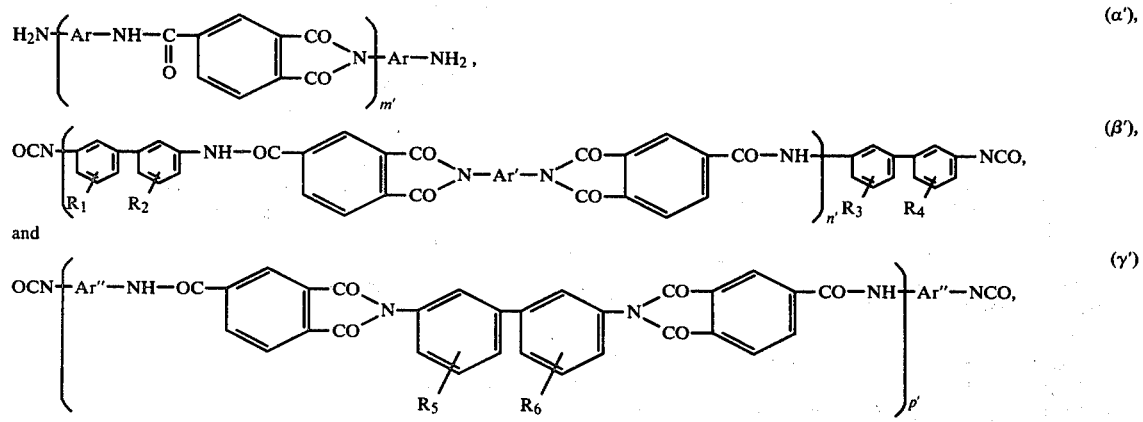

wherein $R_1$ to $R_6$ are the same or different and each represent a hydrogen atom, a ($C_1$-$C_4$) alkyl group or a halogen atom, Ar represents

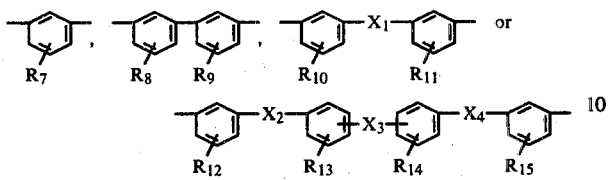

wherein $R_7$ to $R_{15}$ are the same or different and each have the same meaning as defined with respect to $R_1$ to $R_6$ and $X_1$ to $X_4$ are the same or different and each represent —O—, —$SO_2$—, —$CH_2$—, —CO—, —COO—, —C($CH_3$)$_2$—, —S— or —($CH_2$)$_2$—, Ar' represents

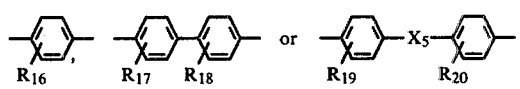

wherein
$R_{16}$ to $R_{20}$ are the same or different and each have the same meaning as defined with respect to $R_1$ to $R_6$ and
$X_5$ has the same meaning as defined with respect to $X_1$ to $X_4$,
Ar" has the same meaning as defined with respect to Ar or Ar', and
m', N' and p' are integers corresponding to reduced viscosities of 0.1 to 2.0 with respect to the polyamide-imide ($\alpha'$), the polyamide-imide ($\beta'$) and the polyamide-imide ($\gamma'$), respectively.

The above-mentioned organic polar solvent-soluble polyamide-imides ($\alpha'$), ($\beta'$) and ($\gamma'$) each having aromatic nuclei linked at their respective 1- and 3-positions can be prepared according to substantially the same procedures as disclosed in Japanese Patent Application Publications No. 35076/1974, No. 13516/1974, No. 41119/1974, No. 41120/1974 and No. 42920/1974. Illustratively stated, the following methods may be employed. That is, a method in which an aromatic diamine represented by the formula

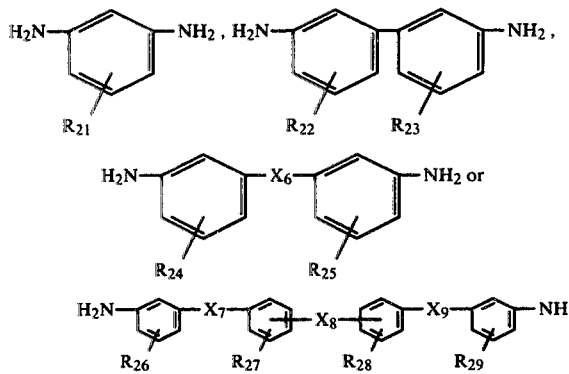

wherein $R_{21}$ to $R_{29}$ are the same or different and each represent a hydrogen atom, a ($C_1$-$C_4$) alkyl group or a halogen atom, and $X_6$ to $X_9$ are the same or different and each represent —O—, —$SO_2$—, —$CH_2$—, —CO—, COO—, —C($CH_3$)$_2$—, —S— or —($CH_2$)$_2$—.

is reacted with 4-acid chloride of trimellitic acid anhydride or the like;

a method in which a bisimide dicarboxylic acid represented by the formula

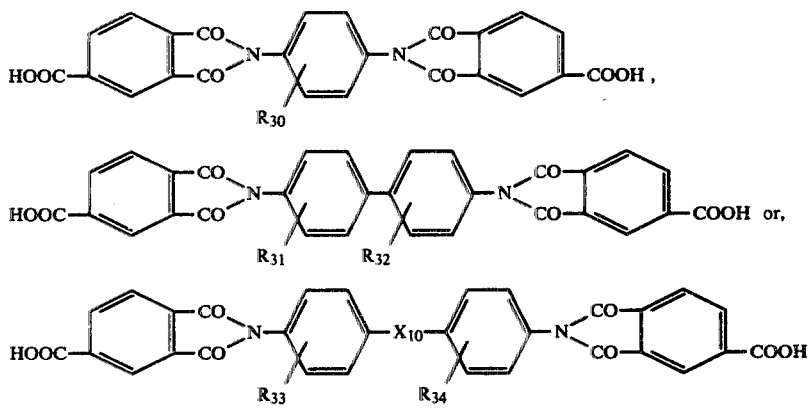

wherein
$R_{30}$ to $R_{34}$ are the same or different and each represent a hydrogen atom, a ($C_1$-$C_4$) alkyl group or a halogen atom,
and $X_{10}$ represents —O—, —$SO_2$—, —$CH_2$—, —CO—, —COO—, —C($CH_3$)$_2$—, —S— or —($CH_2$)$_2$ is reacted with a 3,3'-diisocyanato diphenyl; and a method in which a diisocyanate represented by the formula

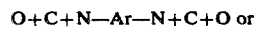
O+C+N—Ar—N+C+O or

O+C+N—Ar'—N+C+O

Ar represents

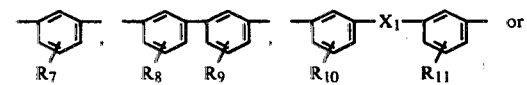

-continued

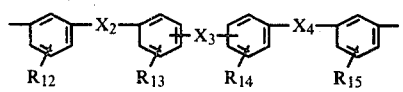

wherein
R$_7$ to R$_{15}$ have the same meaning as defined before and
X$_1$ to X$_4$ have the same meaning as defined before, and Ar' represents

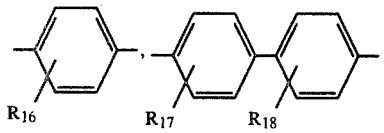

or

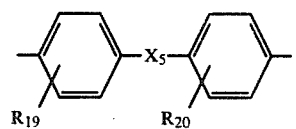

wherein
R$_{16}$ to R$_{20}$ have the same meaning as defined before and
X$_5$ has the same meaning as defined before,
is reacted with a bisimide dicarboxylic acid of the formula

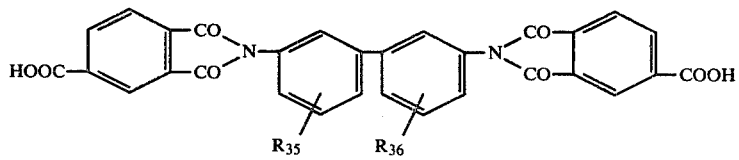

wherein R$_{35}$ and R$_{36}$ are the same or different and each represent a hydrogen atom, a (C$_1$-C$_4$) alkyl group or a halogen atom.

When the introduction of acrylate or methacrylate groups into the terminals of the organic polar solvent-soluble aromatic polyamide-imide (α), (β) or (γ) is intended, it is preferred that in practicing the above-mentioned three methods the molar amount of the diisocyanate or the diamine to be employed be larger than that of the carboxylic acid or the carboxylic acid derivative and the molar ratio should be adjusted, taking into consideration the desired degree of polymerization.

The substituents (A') in the polymers (α), (β) and (γ) are each a member selected from the residual groups of acrylic acid chloride, methacrylic acid chloride, glycidyl acrylate and glycidyl methacrylate, and the substituents (A) in the polymers (β) and (γ) are each a group formed by the reaction of -NCO with acrylic acid, methacrylic acid, a hydroxy acrylate or a hydroxy methacrylate. The residual groups may be introduced alone or in combination. Those groups formed by the above-mentioned reaction of —NCO may also be introduced alone or in combination. However, in the specification, the term "introduction of acrylate or methacrylate" is often used to include the introduction of the above-mentioned residual groups alone or in combination and the introduction of those groups formed by the above-mentioned reaction of —NCO alone or in combination.

In the present invention, the organic polar solvent-soluble aromatic polyamide-imides (α), (β) and (γ) each have a reduced viscosity of 0.1 to 2.0, preferably 0.3 to 1.5. The organic polar solvent-soluble aromatic polyamide-imides (α'), (β') and (γ') to be employed for the introduction thereinto of acrylate or methacrylate groups, each also have a reduced viscosity of 0.1 to 2.0, preferably 0.3 to 1.5.

For preparing a photoresist composition using the polar solvent-soluble aromatic polyamide-imide, the aromatic polyamide-imide is mixed with a photopolymerization initiator and a compound having in its molecule at least one ethylenically unsaturated double bond.

The photopolymerization initiator can be selected from carbonyl compounds, peroxides, azo compounds, sulfur compounds, halogen compounds and mixtures thereof. Specific examples of such a photopolymerization initiator include carbonyl compounds such as acetophenone, diacetyl, benzophenone, benzoin, benzoin isopropyl ether, chloroanthraquinone and naphthoquinone; peroxides such as benzoyl peroxide; azo compounds such as 2,2'-azobisisobutyronitrile; sulfur compounds such as tetraethylthiuram disulfide; halogen compounds such as carbon tetrachloride; and the like. They may be used either alone or in mixture. Of these photopolymerization initiators, carbonyl compounds are especially preferred. The amount of the photopolymerization initiator to be used is 0.01 to 20 parts by weight, preferably 0.1 to 10 parts by weight per 100 parts by weight of the polyamide-imide having acrylate groups or methacrylate groups introduced thereinto or having no substituents introduced thereinto.

In the photoresist composition of the present invention, there is employed 0.1 to 100 parts by weight of a compound having in its molecule at least one ethylenically unsaturated double bond (hereinafter often referred to as "ethylenically unsaturated compound") per 100 parts by weight of the aromatic polyamide-imide. Specific examples of such a compound having in its molecule at least one ethylenically unsaturated double bond which compound may be used in the present invention include 2-ethylhexyl acrylate, 2-ethylhexyl methacrylate, methoxypolyethylene glycol acrylate (number average molecular weight: 200 to 20,000), methoxypolyethylene glycol methacrylate (number average molecular weight: 200 to 20,000), polypropylene glycol monoacrylate (number average molecular weight: 1,000 to 20,000), polypropylene glycol monomethacrylate (number average molecular weight: 1,000 to 20,000), ethylene glycol diacrylate, ethylene glycol dimethacrylate, butylene glycol diacrylate, butylene glycol dimethacrylate, polypropylene glycol diacrylate (number average molecular weight: 1,000 to 20,000), polypropylene glycol dimethacrylate (number average molecular weight: 1,000 to 20,000), trimethylolpropane triacrylate, trimethylolpropane trimethacrylate, tetramethylolmethane tetraacrylate, tetramethylolmethane tetramethacrylate, acrylamide, methacrylamide, N,N'-methylenebisacrylamide, N,N'-methylenebismethacrylamide, hexamethylenebisacrylamide and hexamethylenebismethacrylamide. Of these compounds, those having in its molecule 2 to 4 ethylenically unsaturated double bonds are especially preferred. In the present photoresist composition, the amount of the compound having in its molecule at least one ethylenically unsaturated double bond is 0.1 to 100 parts by weight, preferably 0.5 to 50 parts by weight per 100 parts of the aromatic polyamide-imide.

In use of the photoresist composition of the present invention, the composition is dissolved in a suitable solvent capable of substantially dissolving the present photoresist composition, such as the aforementioned organic polar solvents. The viscosity of the solution of the photoresist composition may be suitably adjusted according to a desired thickness of the photoresist composition layer. The solution can be applied onto the surface of a substrate by spray coating, dipping, roll coating or the like.

One mode of the formation of image by using a photoresist composition is as follows. The photoresist composition is coated, using a solution thereof, on a substrate and dried to the extent that the coat layer has substantially no tack. In order to effect photopolymerization by means of acrylate or methacrylate groups, the coat layer is exposed to actinic rays, e.g., ultraviolet rays from a mercury lamp or the like through a mask to obtain a desired pattern. The exposure time is not critical and may be appropriately chosen. Even though the composition is exposed to actinic rays for a long time, there is, in general, no detrimental influence on the property of the resultant photoresist. After the exposure, the unexposed portions are washed away with a suitable solvent, such as the above-mentioned polymerization solvents, mixed solvents of the abovementioned polymerization solvents and precipitating solvents, aqueous alkali solutions and the like, and are optionally subjected to heat-treatment. The resultant photoresist is not only well resistant to temperatures as high as 300° to 500° C. but also excellent in insulating property, and can be advantageously used as various resists, such as an etching resist, a plating resist, a soldering resist, etc.

The present invention will now be described in detail with reference to the following Examples that by no means limit the scope of the present invention.

The properties shown herein were measured by the following methods.

Reduced viscosity: Measured at 30° C. with respect to a 0.5% solution of the polyamide-imide in N,N-dimethylacetamide, using an Ostwald's viscometer which is commonly employed.

Rate of substituent-introduction:
 Nuclear magnetic resonance method using a high resolution type NMR (Model JNM-MH-100) manufactured by Nihon Denshi K.K., Japan
 Solvent: N,N-dimethylacetamide (D-compound)
 Positions of peaks: acrylate and methacrylate groups are found at 5.78 and 6.16 ppm
Number average molecular weight:
 GPC measuring apparatus: Model 200 manufactured by Water Assoc. Co., U.S.A.
 Column: G 1000S—G 3000S manufactured by Toyo Soda Kogyo K.K., Japan
 Solvent: trichlorobenzene
 Measuring temperature: 135° C.

Heat resistance: The test sample is heated, using a thermobalance, under the stream of a nitrogen gas at a rate of temperature elevation of 10° C./min. The limitary temperature until which no substantial weight decrease is observed, is measured.

EXAMPLE 1

2.5 g (0.023 mole) of m-phenylenediamine and 2 ml of pyridine were dissolved into 35 ml of N,N-dimethylacetamide while introducing a dry nitrogen gas, and the resulting solution was cooled to 5° C. in an ice-water bath. 4.3 g (0.020 mole) of 4-acid chloride of trimellitic acid anhydride were then added to the solution. Immediately, an exothermic reaction started and the temperature of the solution rose to 35° C. The solution was cooled to room temperature in a water bath. It took about 30 minutes from the start of the reaction to the cooling of the solution to room temperature. The solution was stirred at room temperature for 1 hour. Subsequently, a mixture of 10 ml of acetic ahydride and 4 ml of pyridine was added to the solution and the resulting mixture was stirred at 50° C. for 2 hours to obtain a solution of an organic polar solvent-soluble polyamide-imide in N,N-dimethylacetamide. The solution was poured into a mixed solvent of 250 ml of methanol and 500 ml of water to precipitate the polyamide-imide. Subsequently, the precipitate of the polyamide-imide was washed with methanol and dried. 1.5 g of the polyamide-imide thus obtained were dissolved into 20 ml of N,N-dimethylacetamide. 0.81 g of glycidyl methacrylate was added to the solution and the resulting mixture was stirred at 55° C. for 5 hours to effect reaction. The reaction mixture thus obtained was poured into a mixed solvent of 125 ml of methanol and 250 ml of water to precipitate a polyamide-imide having methacrylate groups introduced thereinto. Subsequently, the precipitate of the polyamide-imide having methacrylate groups introduced thereinto was washed with methanol and dried to obtain the desired product quantitatively. With respect to the product, the rate of methacrylate group-introduction was 5% based on the total reactive groups of the polyamide-imide without methacrylate groups introduced thereinto.

0.2 g of the polyamide-imide having methacrylate groups introduced thereinto and 0.01 g of tetramethylolmethane tetraacrylate and 0.004 g of benzoin isopropyl ether were dissolved into 4.0 ml of N,N-dimethylacetamide, and the resulting solution was applied onto a glass substrate and dried to give a photoresist composition layer having a thickness of 5 μ.

The photoresist composition layer was exposed in a predetermined pattern to actinic rays emitted from a 3 KW mercury lamp for 5 minutes. The non-exposed areas of the photoresist composition layer was washed away with N,N-dimethylacetamide to subject the layer to development. A photoresist having a desired pattern was formed on the glass substrate. The heat resistance of the photoresist was tested using a thermobalance under the stream of a nitrogen gas at a rate of temperature elevation of 10° C./min. No substantial weight decrease was observed until the temperature was elevated to 400° C. The volume resistivity of the photoresist was $3 \times 10^{-16} \Omega.cm$.

The reduced viscosity of the polyamide-imide having methacrylate groups introduced thereinto was 1.7.

EXAMPLE 2

2.8 g (0.023 mole) of 2,4-tolylenediamine and 2 ml of pyridine were dissolved into 35 ml of N,N-dimethylacetamide while introducing a dry nitrogen gas, and the resulting solution was cooled to 5° C. in an ice-water bath. 4.3 g (0.020 mole) of 4-acid chloride of trimellitic acid anhydride were then added to the solution. Immediately, an exothermic reaction started and the temperature of the solution rose to 35° C. The solution was cooled to room temperature in a water bath. It took about 30 minutes from the start of the reaction to the cooling of the solution to room temperature. The solution was stirred at room temperature for 1 hour. Subsequently, a mixture of 10 ml of acetic anhydride and 4 ml of pyridine was added to the solution and the resulting mixture was stirred at 50° C. for 2 hours to obtain a solution of an organic polar solvent-soluble polyamide-imide in N,N-dimethylacetamide. The solution was poured into a mixed solvent of 250 ml of methanol and 500 ml of water to precipitate the polyamide-imide. Subsequently, the precipitate of the polyamide-imide was washed with methanol and dried. 1.5 g of the polyamide-imide thus obtained were dissolved into 20 ml of N,N-dimethylacetamide. 0.52 g of acrylic acid chloride and 1 ml of pyridine were added to the solution and the resulting mixture was stirred at 55° C. for 9 hours to effect reaction. The reaction mixture thus obtained was poured into a mixed solvent of 125 ml of methanol and 250 ml of water to precipitate a polyamide-imide having acrylate groups introduced thereinto. Subsequently, the precipitate of the polyamide-imide having acrylate groups introduced thereinto was washed with methanol and dried to obtain the desired product quantitatively. With respect to the product, the rate of acrylate group-introduction was 10% based on the total reactive groups of the polyamide-imide without acrylate groups introduced thereinto.

0.2 g of the polyamide-imide having acrylate groups introduced thereinto and 0.01 g of trimethylolpropane triacrylate and 0.004 g of 1,4-naphthoquinone were dissolved into 2.0 ml of N,N-dimethylacetamide, and the resulting solution was applied onto a glass substrate and dried to give a photoresist composition layer having a thickness of 25 $\mu$.

The photoresist composition layer was exposed in a predetermined pattern to actinic rays emitted from a 3 KW mercury lamp for 5 minutes. The non-exposed areas of the photoresist composition layer was washed away with a mixed solvent of N,N-dimethylacetamide-methanol (3/2 by volume) to subject the layer to developement. A photoresist having a desired pattern was formed on the glass substrate. The heat resistance of the photoresist was tested using a thermobalance under the stream of a nitrogen gas at a rate of temperature elevation of 10° C./min. No substantial weight decrease was observed until the temperature was elevated to 400° C. The volume resistivity of the photoresist was $4 \times 10^{-16} \Omega.cm$.

The reduced viscosity of the polyamide-imide having acrylate groups introduced thereinto was 0.7.

EXAMPLE 3

1.9 g of 3,3'-diaminodiphenyl were dissolved into a mixed solvent of 12 ml of N,N-dimethylacetamide and 12 ml of toluene while introducing a dry nitrogen gas. 2.1 g of 4-acid chloride of trimellitic acid anhydride was then added to the solution while introducing the dry nitrogen gas. Immediately, an exothermic reaction stated and the temperature of the solution rose to 40° C. The solution was cooled to room temperature in a water bath. It took about 30 minutes from the start of the reaction to the cooling of the solution to room temperature. The solution was stirred at room temperature for 1 hour. 1.5 g of phenyl glycidyl ether were added to the solution and the resulting solution was stirred for 10 minutes. The temperature of the solution was elevated to 100° C. and the solution was further stirred for 1 hour. The solution was diluted with 10 ml of N,N-dimethylacetamide and the diluted solution was added to a mixed solvent of 250 ml of methanol and 500 ml of water to precipitate an organic polar solvent-soluble polyamide-imide, followed by filtration of the same. The precipitate of the polyamide-imide was then washed with water and methanol and dried.

2 g of the polyamide-imide thus obtained were dissolved into 20 ml of N,N-dimethylacetamide. Subsequently, 0.8 g of acrylic acid chloride and 2 ml of pyridine were added to the solution and the resulting mixture was stirred at 50° C. for 7 hours. Subsequently, the reaction mixture thus obtained was poured into a mixed solvent of 250 ml of water and 125 ml of methanol to precipitate a polyamide-imide having acrylate groups introduced thereinto. The precipitate of the polyamide-imide was washed with methanol and dried to obtain the desired product quantitatively. With respect to the product, the rate of acrylate group-introduction was 10% based on the total reactive groups of the polyamide-imide without acrylate groups introduced thereinto.

0.5 g of the polyamide-imide having acrylate groups introduced thereinto and 0.1 g of N,N'-methylenebisacrylamide and 0.02 g of benzophenone were dissolved into 5.0 ml of N,N-dimethylacetamide, and the resulting solution was applied onto a glass substrate and dried to give a photoresist composition layer having a thickness of 12 $\mu$.

A photoresist having a desired pattern was formed on the glass substrate according to substantially the same procedures of exposure and development as described in Example 1. The heat resistance of the photoresist was tested in substantially the same manner as described in Example 1. No substantial weight decrease was observed until the temperature was elevated to 400° C. The volume resistivity of the photoresist was $5 \times 10^{-16} \Omega.cm$.

The reduced viscosity of the polyamide-imide having acrylate groups introduced thereinto was 0.5.

EXAMPLE 4

2.7 g of a bisimide dicarboxylic acid, which had been prepared from 4,4'-diaminodiphenyl ether and trimellitic acid anhydride according to substantially the same procedures as described in Japanese Patent Application Publication No. 42920/1974, and 1.3 g of 3,3'-diisocyanato diphenyl were dissolved into 20 ml of N,N-dimethylacetamide and the resulting solution was stirred at 130° C. for 2 hours, while introducing a dry nitrogen gas, to obtain a solution of an organic polar solvent-soluble polyamide-imide in N,N-dimethylacetamide. 2 g of acrylic acid were then added to the solution and the resulting mixture was stirred at 130° C. for 2 hours. Subsequently, the reaction mixture thus obtained was poured into a mixed solvent of 500 ml of water and 250 ml of methanol to precipitate a polyamide-imide having acrylate groups introduced thereinto. The precipitate of the polyamide-imide having acrylate groups introduced thereinto was washed with methanol and dried to obtain the desired product quantitatively. With respect to the product, the rate of acrylate group-introduction was 5% based on the total reactive groups of the polyamide-imide without acrylate groups introduced thereinto.

0.5 g of the polyamide-imide having acrylate groups introduced thereinto and 0.05 g of 1,4-butylene glycol methacrylate and 0.01 g of acetophenone were dissolved into 5.0 ml of N-methyl-2-pyrrolidone, and the resulting solution was applied onto a glass substrate and dried to give a photoresist composition layer having a thickness of 25μ.

A photoresist having a desired pattern was formed on the glass substrate according to substantially the same procedures of exposure and development as described in Example 1. The heat resistance of the photoresist was tested in substantially the same manner as described in Example 1. No substantial weight decrease was observed until the temperature was elevated to 400° C. The volume resistivity of the photoresist was $8 \times 10^{-16} \Omega \cdot cm$.

The reduced viscosity of the polyamide-imide having acrylate groups introduced thereinto was 0.3.

EXAMPLE 5

2.3 g of a bisimide dicarboxylic acid, which had been prepared from p-phenylenediamine and trimellitic acid anhydride according to substantially the same procedures as described in Japanese Patent Application Publication No. 42920/1974, and 1.3 g of 3,3'-diisocyanato diphenyl were dissolved into 20 ml of N,N-dimethylacetamide and the resulting solution was stirred at 130° C. for 2 hours, while introducing a dry nitrogen gas to obtain a solution of an organic polar solvent-soluble polyamide-imide in N,N-dimethylacetamide. 2 g of 2-hydroxyethyl methacrylate were then added to the solution and the resulting mixture was stirred at 50° C. for 2 hours. Subsequently, the reaction mixture thus obtained was poured into a mixed solvent of 500 ml of water and 250 ml of methanol to precipitate a polyamide-imide having methacrylate groups introduced thereinto. The precipitate of the polyamide-imide having methacrylate groups introduced thereinto was washed with methanol and dried to obtain the desired product quantitatively. With respect to the product, the rate of methacrylate group-introduction was 10% based on the total reactive groups of the polyamide-imide without methacrylate groups introduced thereinto.

0.5 g of the polyamide-imide having methacrylate groups introduced thereinto and 0.05 g of ethylene glycol diacrylate and 0.02 g of 2,2'-azobisisobutyronitrile were dissolved into 5.0 ml of N-methyl-2-pyrrolidone, and the resulting solution was applied onto a glass substrate and dried to give a photoresist composition layer having a thickness of 2.0μ.

A photoresist having a desired pattern was formed on the glass substrate according to substantially the same procedures of exposure and development as described in Example 1. The heat resistance of the photoresist was tested in substantially the same manner as described in Example 1. No substantial weight decrease was observed until the temperature was elevated to 400° C. The volume resistivity of the photoresist was $6 \times 10^{-16} \Omega \cdot cm$.

The reduced viscosity of the polyamide-imide having methacrylate groups introduced thereinto was 0.3.

EXAMPLE 6

2.6 g of a bisimide dicarboxylic acid, which had been prepared from 3,3'-diaminodiphenyl and trimellitic acid anhydride according to the procedures as described in Japanese Patent Application Publication No. 42920/1974, and 1.4 g of diphenylmethane 4,4'-diisocyanate were dissolved into 20 ml of N,N-dimethylacetamide and the resulting solution was stirred at 130° C. for 2 hours, while introducing a dry nitrogen gas, to obtain a solution of an organic polar solvent-soluble polyamide-imide in N,N-dimethylacetamide. 1 g of glycidyl methacrylate and 1 g of 2-hydroxypropyl methacrylate were then added to the solution and the resulting mixture was stirred at 60° C. for 4 hours. Subsequently, the reaction mixture thus obtained was poured into a mixed solvent of 500 ml of water and 250 ml of methanol to precipitate a polyamide-imide having methacrylate groups introduced thereinto. The precipitate of the polyamide-imide having methacrylate groups introduced thereinto was washed with methanol and dried to obtain the desired product quantitatively. With respect to the product, the rate of methacrylate group-introduction was 15% based on the total reactive groups of the polyamide-imide without methacrylate groups introduced thereinto.

0.5 g of the polyamide-imide having methacrylate groups introduced thereinto and 0.03 g of hexamethylenebisacrylamide and 0.01 g of benzoyl peroxide were dissolved into 10.0 ml of N-methyl-2-pyrrolidone, and the resulting solution was applied onto a glass substrate and dried to give a photoresist composition layer having a thickness of 15μ.

A photoresist having a desired pattern was formed on the glass substrate according to substantially the same procedures of exposure and development as described in Example 1. The heat resistance of the exposed photoresist was tested in substantially the same manner as described in Example 1. No substantial weight decrease was observed until the temperature was elevated to 400° C. The volume resistivity of the photoresist was $3 \times 10^{-16} \Omega \cdot cm$.

The reduced viscosity of the polyamide-imide having methacrylate groups introduced thereinto was 0.7.

EXAMPLE 7

2.5 g (0.023 mole) of m-phenylenediamine and 2 ml of pyridine were dissolved into 35 ml of N,N-dimethylacetamide while introducing a dry nitrogen gas, and the resulting solution was cooled to 5° C. in an ice-water bath. 4.3 g (0.020 mole) of 4-acid chloride of trimellitic acid anhydride were then added to the solution. Immediately, an exothermic reaction started and the temperature of the solution rose to 35° C. The solution was cooled to room temperature in a water bath. It took about 30 minutes from the start of the reaction to the cooling of the solution to room temperature. The solution was stirred at room temperature for 1 hour. Subsequently, a mixture of 10 ml of acetic anhydride and 4 ml of pyridine was added to the solution and the resulting mixture was stirred at 50° C. for 2 hours to obtain a solution of an organic polar solvent-soluble polyamide-imide in N,N-dimethylacetamide. The solution was poured into a mixed solvent of 250 ml of methanol and 500 ml of water to precipitate the polyamide-imide. Subsequently, the precipitate of the polyamide-imide was washed with methanol and dried.

0.2 g of the polyamide-imide and 0.06 g of tetramethylolmethane tetraacrylate and 0.008 g of benzoin isopropyl ether were dissolved into 2.0 ml of N,N-dimethylacetamide, and the resulting solution was applied onto a glass substrate and dried to give a photoresist composition layer having a thickness of 10μ.

The photoresist composition layer was exposed in a predetermined pattern to actinic rays emitted from a 3 KW mercury lamp for 5 minutes. The non-exposed areas of the photoresist layer was washed away with N,N-dimethylacetamide to subject the layer to development. A photoresist having a desired pattern was formed on the glass substrate. The heat resistance of the photoresist was tested using a thermobalance under the stream of a nitrogen gas at a rate of temperature elevation of 10° C./min. No substantial weight decrease was observed until the temperature was elevated to 350° C. The volume resistivity of the photoresist was $6 \times 10^{-16} \Omega \cdot cm$.

The reduced viscosity of the polyamide-imide was 0.4.

EXAMPLES 8 to 10

A polyamide-imide having acrylate or methacrylate groups introduced thereinto was prepared in substantially the same manner as described in Example 6 except that, in place of 1 g of glycidyl methacrylate and 1 g of 2-hydroxypropyl methacrylate, two or three kinds of compounds as indicated in Table 1 were each used in an amount of 1 g and that 3 ml of pyridine was used as a catalyst. The rate of acrylate or methacrylate group-introduction and reduced viscosity of the polyamide-imide having acrylate or methacrylate groups introduced thereinto were shown in Table 1.

A photoresist composition layer was formed on a glass substrate in substantially the same manner as described in Example 6 and a photoresist having a desired pattern was formed on the glass substrate according to substantially the same procedures of exposure and development as described in Example 1. The heat resistance and volume resistivity of the photoresist were excellent as shown in Table 1.

Table 1

| Example No. | Compound | Reduced Viscosity | Rate of Acrylate or Methacrylate Group-Introduction (%) | Heat Resistance (°C.) | Volume Resistivity (Ω . cm) |
|---|---|---|---|---|---|
| 8 | Methacrylic acid chloride Methacrylic acid | 0.7 | 15 | 400 | $4 \times 10^{-16}$ |

Table 1-continued

| Example No. | Compound | Reduced Viscosity | Rate of Acrylate or Methacrylate Group-Introduction (%) | Heat Resistance (°C.) | Volume Resistivity (Ω . cm) |
|---|---|---|---|---|---|
| 9 | Glycidyl acrylate 2-Hydroxyethyl acrylate | 0.7 | 10 | 400 | $3 \times 10^{-16}$ |
| 10 | Acrylic acid chloride 2-Hydroxypropyl acrylate Acrylic acid | 0.7 | 15 | 400 | $5 \times 10^{-16}$ |

EXAMPLES 11 to 16

A polyamide-imide having acrylate groups introduced thereinto was prepared in substantially the same manner as described in Example 2, using 1.5 g of a polyamide-imide which has been prepared from an aromatic diamine as indicated in Table 3 and 4-acid chloride of trimellitic acid anhydride in substantially the same manner as described in Example 2. The rate of acrylate group-introduction and reduced viscosity of the polyamide-imide having acrylate groups introduced thereinto were as shown in Table 2.

A photoresist composition layer was formed on a glass substrate in substantially the same manner as described in Example 2 and a photoresist having a desired pattern was formed on the glass substrate according to substantially the same procedures of exposure and development as described in Example 2. The heat resistance and volume resistivity of the photoresist were excellent as shown in Table 2.

Table 2

| Example No. | Aromatic Diamine | Reduced Viscosity | Rate of Acrylate Group-Introduction (%) | Heat Resistance (°C.) | Volume Resistivity (Ω . cm) |
|---|---|---|---|---|---|
| 11 | 3,3'-Diaminodiphenyl sulfone | 0.5 | 15 | 400 | $6 \times 10^{-16}$ |
| 12 | 3,3'-Diaminobenzophenone | 0.7 | 10 | 400 | $5 \times 10^{-16}$ |
| 13 | 3,3'-Diaminodiphenyl sulfide | 1.5 | 5 | 400 | $3 \times 10^{-16}$ |
| 14 | 3,3'-Diaminodibenzyl | 0.2 | 30 | 400 | $8 \times 10^{-16}$ |
| 15 | 3,3'-Diaminodiphenylmethane | 0.4 | 20 | 400 | $6 \times 10^{-16}$ |
| 16 | 4,4'-Bis(M-aminophenoxy)diphenyl ether | 0.8 | 10 | 400 | $4 \times 10^{-16}$ |

EXAMPLE 17

A mixed polyamide-imide of 0.75 g of the polyamide-imide having no acrylate groups introduced thereinto which had been prepared in Example 2 and 0.75 g of the polyamide-imide having no acrylate groups introduced thereinto which had been prepared in Example 4 was subjected to acrylate group-introduction in substantially the same manner as described in Example 2 to obtain a mixed polyamide-imide having acrylate groups introduced thereinto at a rate of 8% based on the total reactive groups of the mixed polyamide-imide without acrylate groups introduced thereinto.

A photoresist composition layer was formed on a glass substrate in substantially the same manner as described in Example 2, and a photoresist having a desired pattern was formed on the glass substrate according to substantially the same procedures of exposure and development as described in Example 2. The heat resistance of the photoresist was 400° C. and the volume resistivity of the photoresist was $5 \times 10^{-16} \Omega \cdot cm$.

What is claimed is:

1. A heat resistant photoresist composition comprising:

(1) 100 parts by weight of a polymer selected from the group consisting of
a polymer (α) of the general formula

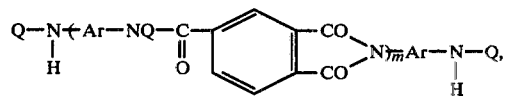

a polymer (β) of the general formula

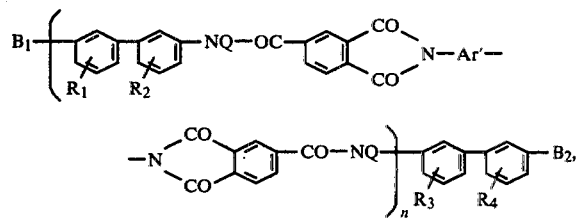

a polymer (γ) of the general formula

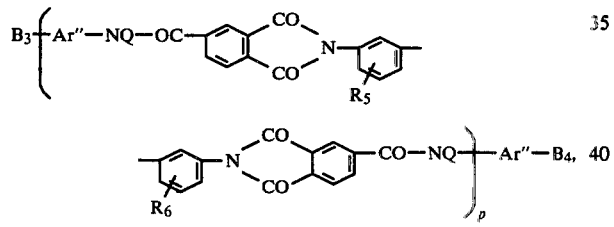

mixtures thereof
wherein
$R_1$ to $R_6$ are the same or different and each represent a hydrogen atom, a ($C_1$—$C_4$) alkyl group or a halogen atom,
Ar represents

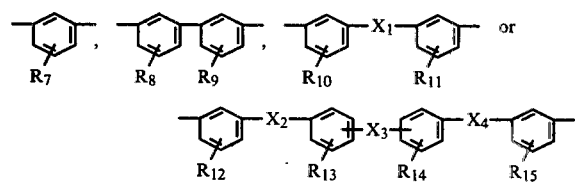

wherein
$R_7$ to $R_{15}$ are the same or different and each have the same meaning as defined with respect to $R_1$ to $R_6$ and $X_1$ to $X_4$ are the same or different and each represent —O—, —$SO_2$—, —$CH_2$—, —CO—, —COO—, —$C(CH_3)_2$—, —S— or —$(CH_2)_2$—,
Ar' represents

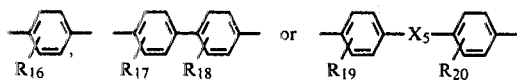

wherein
$R_{16}$ to $R_{20}$ are the same or different and each have the same meaning as defined with respect to $R_1$ to $R_6$ and
$X_5$ has the same meaning as defined with respect to $X_1$ to $X_4$,
Ar" has the same meaning as defined with respect to Ar or Ar',
$B_1$ to $B_4$ are the same or different and each represent —NCO or a substituent (A) formed by the reaction of —NCO with acrylic acid, methacrylic acid, a hydroxy acrylate or a hydroxy methacrylate, Q represents a hydrogen atom, or a hydrogen atom and a substituent (A'), provided that each of the rates of substituent introduction into the molecules of the polymers (α), (β) and (γ) as defined by the formulae $$\frac{\text{number of substituent } (A') \text{ in the molecule}}{m + 2} \times 100,$$

$$\frac{\text{number of substituents } (A) + (A') \text{ in the molecule}}{2 \times n + 2} \times 100 \text{ and}$$

$$\frac{\text{number of substituents } (A) + (A') \text{ in the molecule}}{2 \times p + 2} \times 100$$

with respect to the polymer (α), the polymer (β) and the polymer (γ), respectively, is 0 to 50%, said substituent (A') being a member selected from residual groups of acrylic acid chloride, methacrylic acid chloride, glycidyl acrylate and glycidyl methacrylate, said residual groups being introduced alone or in combination, and m, n and p are integers corresponding to reduced viscosities of 0.1 to 2.0 with respect to the polymer (α) the polymer (β) and the polymer (γ), respectively;

(2) 0.01 to 20 parts by weight of a photopolymerizationinitiator; and (3) 0.1 to 100 parts by weight of a compound having in its molecule at least one ethylenically unsaturated double bond.

2. A heat resistant photoresist composition according to claim 1, wherein said compound having in its molecule at least one ethylenically unsaturated double bond has 2 to 4 ethylenically unsaturated double bonds.

3. A heat resistant photoresist composition according to claim 1, wherein said photopolymerization initiator is a member selected from the group consisting of carbonyl compounds, peroxides, azo compounds, sulfur compounds, halogen compounds and mixtures thereof.

4. A heat resistant photoresist composition according to claim 3, wherein said photopolymerization initiator is a member selected from carbonyl compounds.

5. A heat resistant photoresist composition according to claim 1, wherein the amount of the compound having in its molecule at least one ethylenically unsaturated double bond is 0.5 to 50 parts by weight.

6. A process for the preparation of a heat resistant photoresist composition which comprises: reacting an organic polar solvent-soluble aromatic polyamide-imide having aromatic nuclei linked at their respective 1-and 3-positions and selected from the group consisting of a polyamide-imide (α') of the general formula

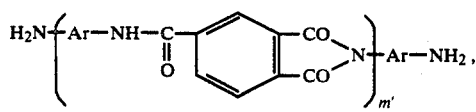

a polyamide-imide (β') of the general formula

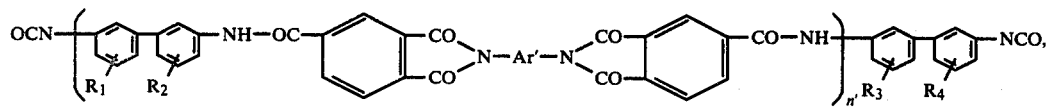

a polyamide-imide (γ') of the general formula

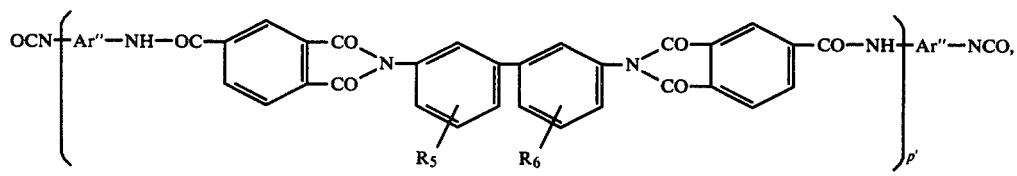

and mixtures thereof
wherein
$R_1$ to $R_6$ are the same or different and each represent a hydrogen atom, a ($C_1$—$C_4$) alkyl group or a halogen atom,
Ar represents

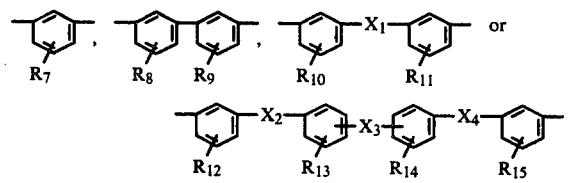

wherein
$R_7$ to $R_{15}$ are the same or different and each have the same meaning as defined with respect to $R_1$ to $R_6$ and $X_1$ to $X_4$ are the same or different and each represent —O—, —$SO_2$—, —$CH_2$—, —CO—, —COO—, —C($CH_3$)$_2$—, —S— or —($CH_2$)$_2$—, Ar' represents $$\begin{array}{c} \phantom{x} \\ R_{16} \end{array}, \begin{array}{cc} \phantom{x} & \phantom{x} \\ R_{17} & R_{18} \end{array} \text{ or } \begin{array}{ccc} \phantom{x} & X_5 & \phantom{x} \\ R_{19} & & R_{20} \end{array}$$

wherein
$R_{16}$ to $R_{20}$ are the same or different and each have the same meaning as defined with respect to $R_1$ to $R_6$ and
$X_5$ has the same meaning as defined with respect to $X_1$ to $X_4$,
Ar" has the same meaning as defined with respect to Ar or Ar', and
m', n' and p' are integers corresponding to reduced viscosities of 0.1 to 2.0 with respect to the polyamide-imide (α!), the polyamide-imide (β!) and the polyamide-imide (γ'), respectively,
with a reactant selected from the group consisting of acrylic acid chloride, methacrylic acid chloride, glycidyl acrylate, glycidyl methacrylate, acrylic acid, methacrylic acid, a hydroxy acrylate, a hydroxy methacrylate and mixtures thereof, in the presence of an organic polar solvent, to produce a polymer; and mixing 100 parts by weight of the resulting polymer with 0.01 to 20 parts by weight of a photopolymerization initiator and 0.1 to 100 parts by weight of a compound having in its molecule at least one ethylenically unsaturated double bond.

* * * * *

UNITED STATES PATENT AND TRADEMARK OFFICE
CERTIFICATE OF CORRECTION

PATENT NO. : 4,208,477
DATED : June 17, 1980
INVENTOR(S) : Kaoru Ohmura, Ichiro Shibasaki, Takeo Kimura It is certified that error appears in the above—identified patent and that said Letters Patent are hereby corrected as shown below:

Column 26, line 33 should read:

mide-imide ($\alpha'$), the polyamide-imide ($\beta'$) and the

Signed and Sealed this

Twenty-third Day of September 1980

[SEAL]

Attest:

SIDNEY A. DIAMOND

Attesting Officer

Commissioner of Patents and Trademark